(12) United States Patent
Meier et al.

(10) Patent No.: US 11,605,910 B2
(45) Date of Patent: Mar. 14, 2023

(54) SET FORMED OF A CONDUCTOR CONNECTION ELEMENT AND A FASTENING ELEMENT

(71) Applicant: WAGO Verwaltungsgesellschaft mbH, Minden (DE)

(72) Inventors: Henning Meier, Bueckeburg (DE); Rudolf Mastel, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 185 days.

(21) Appl. No.: 17/156,099

(22) Filed: Jan. 22, 2021

(65) Prior Publication Data
US 2021/0234293 A1  Jul. 29, 2021

(30) Foreign Application Priority Data
Jan. 24, 2020  (DE) .................. 20 2020 100 373.9

(51) Int. Cl.
*H01R 13/514*  (2006.01)
*H01R 12/70*  (2011.01)
(Continued)

(52) U.S. Cl.
CPC ....... *H01R 12/7047* (2013.01); *H01R 4/4818* (2013.01); *H01R 13/11* (2013.01);
(Continued)

(58) Field of Classification Search
CPC .. H01R 12/7047; H01R 4/4818; H01R 13/11; H01R 13/502; H01R 13/639;
(Continued)

(56) References Cited

U.S. PATENT DOCUMENTS

| 4,611,879 A | * | 9/1986 | Bullard | ............... | H01R 13/514 |
| | | | | | 439/717 |
| 4,954,798 A | * | 9/1990 | Kasahara | ............ | H01H 50/323 |
| | | | | | 335/161 |

(Continued)

FOREIGN PATENT DOCUMENTS

| CN | 113178714 A | 7/2021 |
| DE | 4038710 A1 | 6/1992 |

(Continued)

*Primary Examiner* — Abdullah A Riyami
*Assistant Examiner* — Nelson R. Burgos-Guntin
(74) *Attorney, Agent, or Firm* — Muncy, Geissler, Olds & Lowe , P.C.

(57) ABSTRACT

A set formed of a conductor connection element and a fastening element for fastening the conductor connection element to another component, wherein the conductor connection element has an insulating housing with a conductor insertion opening for inserting an electrical conductor in a direction of conductor insertion, and wherein the fastening element has a connecting arrangement by means of which the fastening element can be fastened to the conductor connection element in a positive-locking manner. The connecting arrangement is configured to allow a fastening of the fastening element to the conductor connection element in multiple different discrete spatial orientations relative to the direction of conductor insertion.

15 Claims, 5 Drawing Sheets

(51) Int. Cl.
  *H01R 4/48* (2006.01)
  *H01R 13/11* (2006.01)
  *H01R 13/502* (2006.01)
  *H01R 13/639* (2006.01)
  *H01R 13/73* (2006.01)
(52) U.S. Cl.
  CPC ......... *H01R 13/502* (2013.01); *H01R 13/639* (2013.01); *H01R 13/73* (2013.01)
(58) Field of Classification Search
  CPC ...... H01R 13/73; H01R 12/7023; H01R 9/24; H05K 2201/09063; H05K 2201/10189; H05K 2201/2072; H05K 3/301
  See application file for complete search history.

(56) References Cited

U.S. PATENT DOCUMENTS

| | | | | |
|---|---|---|---|---|
| 5,062,024 A * | 10/1991 | Hennemann | ......... | H01R 12/515 439/329 |
| 5,098,316 A * | 3/1992 | Kollmann | ............ | H01R 9/2408 439/441 |
| 5,241,451 A * | 8/1993 | Walburn | ................ | H05K 7/142 248/222.12 |
| 5,263,871 A | 11/1993 | Sano | | |
| 5,295,870 A * | 3/1994 | Rei | ...................... | H01R 9/2408 439/717 |
| 5,401,189 A | 3/1995 | Sato | | |
| 5,632,656 A * | 5/1997 | Lo | ......................... | H01R 13/514 439/717 |
| D405,055 S * | 2/1999 | Taylor | ........................... | D13/133 |
| 6,120,332 A * | 9/2000 | Bertens | ............. | H01R 13/6215 439/701 |
| 6,709,299 B2 * | 3/2004 | Listing | ..................... | H01H 9/10 439/762 |
| 10,199,752 B2 * | 2/2019 | Willems | ................ | H01R 9/2408 |
| 10,374,352 B2 * | 8/2019 | Willems | ................ | H01R 13/514 |
| 10,424,864 B2 * | 9/2019 | Hoppmann | ........... | H01R 43/26 |
| 2006/0130551 A1 * | 6/2006 | Durney | ................ | H05K 1/0278 72/324 |
| 2010/0135022 A1 * | 6/2010 | Deguara | ............... | G09F 9/3026 362/249.14 |
| 2015/0357756 A1 * | 12/2015 | Mastel | ................ | H01R 13/639 439/680 |
| 2020/0350722 A1 * | 11/2020 | Mastel | ................ | H01R 13/514 |
| 2021/0210874 A1 * | 7/2021 | Ober-Woerder | ....... | H01R 25/14 |
| 2021/0234293 A1 * | 7/2021 | Meier | ................ | H01R 12/7023 |

FOREIGN PATENT DOCUMENTS

| | | |
|---|---|---|
| DE | 4228531 A1 | 3/1993 |
| DE | 4413001 A1 | 10/1994 |
| DE | 3587796 T2 | 11/1994 |
| FR | 2776844 A3 | 10/1999 |
| JP | 2021119559 A | 8/2021 |

* cited by examiner

SET FORMED OF A CONDUCTOR CONNECTION ELEMENT AND A FASTENING ELEMENT

This nonprovisional application claims priority under 35 U.S.C. § 119(a) to German Patent Application No. DE 20 2020 100 373.9, which was filed in Germany on Jan. 24, 2020 and which is herein incorporated by reference.

BACKGROUND OF THE INVENTION

Field of the Invention

The present invention relates to a set formed of a conductor connection element and a fastening element for fastening the conductor connection element to another component, wherein the conductor connection element has an insulating housing with a conductor insertion opening for inserting an electrical conductor in a direction of conductor insertion and wherein the fastening element has a connecting arrangement by means of which the fastening element can be fastened to the conductor connection element in a positive-locking manner.

Description of the Background Art

Generally speaking, the invention relates to the fastening of a conductor connection element to another component, for example to an electrical printed circuit board, to a housing, or to another region of an electrical device. The conductor connection element can be, in principle, any desired conductor connection element to which at least one electrical conductor can be connected, as for example an electrical plug-and-socket connector or a conductor connection terminal. Known from U.S. Pat. No. 5,401,189 A is a plug-and-socket connector that can be fastened to a printed circuit board, for example, by means of a fastening element that can be pushed laterally onto a flange of the plug-and-socket connector.

SUMMARY OF THE INVENTION

It is therefore an object of the present invention to specify more efficient options for fastening a conductor connection element to another component.

This object is attained in a set formed of a conductor connection element and a fastening element, as mentioned above, by the means that the connecting arrangement is configured to allow a fastening of the fastening element to the conductor connection element in multiple different discrete spatial orientations relative to the direction of conductor insertion. A universal option for fastening the conductor connection element to the other component is created by such a fastening element. The fastening element can be designed in the form of a flange, for example, so that the fastening element can also be referred to as a universal flange on account of its universal fastening options. In addition to the function of fastening the conductor connection element to the other component, the fastening element can also have further functions, such as the function of a spacer and/or of a threaded flange, for example.

Consequently, the conductor connection element can be fastened to the other component in different spatial orientations with the aid of the fastening element, which is made possible by the means that the fastening element itself can be fastened to the conductor connection element in different spatial orientations through its connecting arrangement. The fastening element can be designed to be especially user-friendly here, for example in such a manner that the installation of the fastening element on the conductor connection element, and thus the fastening of the conductor connection element (through the fastening element) to the other component, can be carried out by the user.

According to an example, provision is made that the connecting arrangement is configured to allow a fastening of the fastening element to the conductor connection element in two, three, or four different spatial orientations relative to the direction of conductor insertion. Consequently, a multiplicity of options for fastening the conductor connection element to the other component can be provided by a single fastening element.

According to an example, provision is made that the connecting arrangement is configured to allow a fastening of the fastening element to the conductor connection element in different angular positions, which differ from one another by 90° and/or 180°, relative to the direction of conductor insertion. Accordingly, the conductor connection element can also be fastened to the other component in such orientations differing from one another by 90 degrees or 180 degrees. If the conductor connection element is a plug-and-socket connector, for example, then it can be fastened to an electrical printed circuit board with a plug-in direction parallel to the plane of the printed circuit board or a plug-in direction perpendicular to the plane of the printed circuit board by means of the fastening element.

The connecting arrangement of the fastening element can have different designs, and in particular can support different methods of fastening the fastening element to the conductor connection element, for example by plug-in, clip-on, screw-on, or snap-on fastening.

According to an example, provision is made that the connecting arrangement is configured for fastening of the fastening element to the conductor connection element by means of a linear displacement of the fastening element relative to the conductor connection element. This permits simple fastening of the fastening element to the conductor connection element that is haptically pleasant for the user. The direction of the linear displacement can, in particular, be oriented parallel to a surface of the conductor connection element to which the fastening element is to be fastened by its connecting arrangement to the conductor connection element.

The fastening element can be designed with one or more different types of coupling elements with which the fastening element can be coupled to the other component. For example, the fastening element can have a through opening through which a screw, a stud, a rivet, or a similar elongated fastener can be passed in order to attach the fastening element to the other component. The fastening element can also have one or more snap-in mounting feet, fastening bolts, fastening threads, or similar coupling means as the coupling element.

According to an example, provision is made that the fastening element has a through opening that is configured for fastening of the fastening element to the other component by means of a screw, an elongated stud, a rivet, or a similar elongated fastener that can be passed through the through opening. This permits simple fastening of the fastening element to the other component with off-the-shelf fasteners.

According to an example, provision is made that the fastening element has a threaded element or a receiving space for a threaded element, wherein the fastening element can be fastened to the other component through the threaded element by means of screw mounting. The threaded element can be arranged in a region of the through opening in the fastening element, for example. As a result, the fastening of the fastening element to the other component is simplified still further for the user. In particular, the threaded element can be held on the fastening element in a rotationally fixed manner so that the user need not separately secure the threaded element with a screwdriver or the like when screwing on the fastening element.

According to example, provision is made that the connecting arrangement has at least one first connecting element or at least one first connecting element and one second connecting element. The term "connecting arrangement" is thus used to refer generically to a single such connecting element or multiple such connecting elements. These connecting elements can be arranged in different ways on a body of the fastening element, in particular on external surfaces of the body.

According to example, provision is made that the at least one first connecting element is arranged on a first external surface of the fastening element, and the at least one second connecting element is arranged on the first external surface or another, second external surface of the fastening element. In this way, especially universal options for fastening the conductor connection element to the fastening element can be provided, even with relatively simple shaping of the first and second connecting elements.

According to example, provision is made that the at least one first connecting element is arranged off-center on the first external surface. This has the advantage that different spacing options can be provided by the fastening element depending on the orientation of its fastening to the conductor connection element, so that the fastening element additionally functions as a variable spacer that can be used with different distances selectable by the user at least in discrete values.

According to example, provision is made that the at least one second connecting element is arranged in the center of the first or second external surface. In this way, an option for symmetrically distributed distances in the attachment of the fastening element to the conductor connection element is additionally provided.

According to example, provision is made that the second external surface is an external surface of the fastening element that is turned away from the first external surface.

According to example, provision is made that the second connecting element is configured to allow a fastening of the fastening element to the conductor connection element in an angular position that differs by 90° from the angular position in which the first connecting element allows a fastening of the fastening element to the conductor connection element. Accordingly, each individual connecting element (first and second connecting element) can be relatively simple in design. The option of fastening the fastening element to the conductor connection element in the different spatial orientations can then be provided by the combination of the first and second connecting elements.

According to example, provision is made that the first and/or the second connecting element has a fastening contour that is designed as a dovetail profile or the like. This permits especially reliable fastening of the fastening element to the conductor connection element. It is then necessary to provide an appropriate associated profile on the conductor connection element as a counterpart with which the dovetail-profiled fastening contour of the first and/or second connecting element can be coupled. In this case, either the first and/or the second connecting element can be designed as having a groove with a dovetail profile or as having a tongue with a dovetail profile (in the sense of a tongue and groove connection).

The fastening contour of the first and/or second connecting element preferably can be completely continuous in design. This means that a profiled fastening contour is provided on all four longitudinal sides of the rectangular first and/or second connecting element. Alternatively, the fastening contour of the first and/or second connecting element can be provided on only two opposing longitudinal sides of the connecting element and hence not be completely continuous in design. The rectangular design of the first and/or second connecting element preferably can be designed to be square.

According to example, provision is made that the fastening element has an essentially cuboid body on which the connecting arrangement is arranged on one external cuboid surface or distributed over multiple external cuboid surfaces of the body. This permits simple handling of the fastening element. Because of the cuboid shape, a sufficient number of external surfaces is provided on which a first and a second connecting element can be arranged, for example, and additionally the through opening, for example, can be provided.

An exemplary embodiment of the invention relates to a set formed of a conductor connection element in the form of a plug-and-socket connector and a mating connector associated with the plug-and-socket connector as a counterpart, wherein at least one fastening element of the above-described type on the plug-and-socket connector and/or on the mating connector is fastened through its connecting arrangement to the first positive-locking connecting element of the plug-and-socket connector and/or on the mating connector. This permits advantageous fastening of the plug-and-socket connector through the fastening element in different spatial orientations to be chosen by the user in each case.

The above-mentioned object is additionally attained by a data carrier with CAD design data for the design of a fastening element of a set of the type described above. The advantages described above can be realized by this means, as well.

The fastening element can be provided as, e.g., a plastic part, for example as an injection molded part. Because of the aforementioned data carrier, it is also possible to manufacture the fastening element from a plastic material in a simple manner, for example by means of a 3D printing process.

As a result of the fastening element, an accessory part is provided that combines a multiplicity of functions. In this way the variety of components required for fastening the conductor connection element to the other component is decreased markedly, since the same fastening element can be used essentially always. In this way, production and inventory management are simplified for both the manufacturer and the user.

For the purposes of the present invention, the indefinite article "a" is not to be understood as a number. Thus, for example, if reference is made to "a component," this is to be interpreted in the sense of "at least one component." If angles are specified in degrees, these specifications refer to a circular measurement of 360 degrees (360°).

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
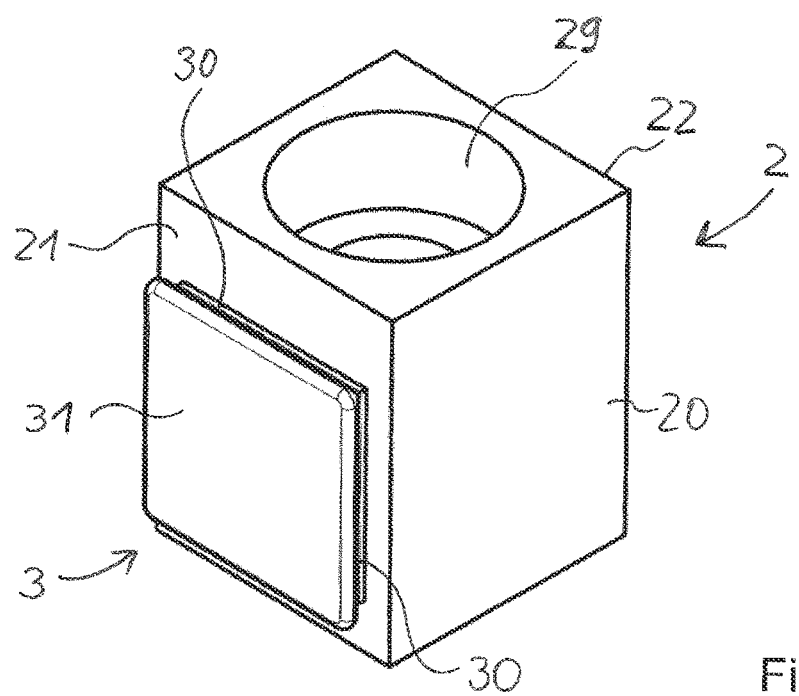
FIG. 1 shows a fastening element in a first embodiment in a perspective representation.
Figure 2:
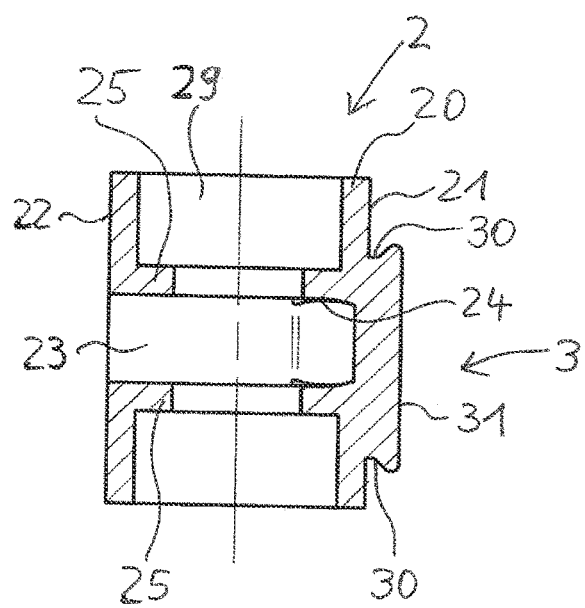
FIG. 2 shows the fastening element from FIG. 1 in a cross-sectional side view along the section line A-A in FIG. 3.
Figure 3:
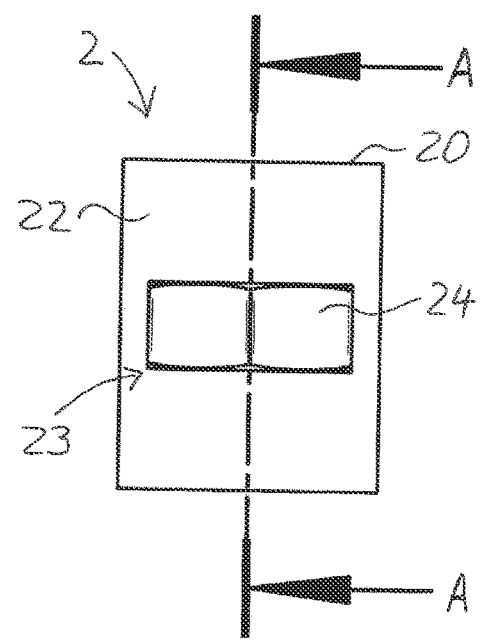
FIG. 3 shows the fastening element from FIG. 1 in a side view.

The fastening element 2 illustrated in FIGS. 1 to 3 has a body 20 that is essentially cuboid and accordingly has six external surfaces, of which a first external surface 21 and a second external surface 22 are labeled with reference symbols. The fastening element 2 has a connecting arrangement 3, through which the fastening element 2 can be fastened in a positive-locking manner to a conductor connection element In the exemplary embodiment shown, the connecting arrangement 3 is composed of one first connecting element 31, which is arranged on the first external surface 21 of the body 20. The first connecting element 31 has continuous fastening contours 30 on the perimeter, for example in the form of dovetail profiles. As a result of the fact that these fastening contours 30 are designed to be completely continuous on the perimeter, the fastening element 2 can be inserted in a correspondingly shaped groove in different spatial orientations, as explained further below with reference to the connection to a conductor connection element.

The fastening element 2 has a through opening 29, which extends completely through the body 20 in a longitudinal direction. A fastener, as for example an elongated stud or a screw, can be passed through this through opening 29, and in this way the fastening element 2 can be fastened to the other component. To simplify this fastening, the fastening element 2 has, in the region of the through opening 29, a receiving space 23 for a threaded element, for example for a nut. The receiving space 23 is delimited in each of the directions of passage of the through opening 29 by walls 25 in which the through opening 29 transitions to a smaller cross-section. In order to secure the threaded element in the receiving space 23 in a simple manner, the receiving space 23 can be provided with molded features 24, for example, which are designed as a counterpart to the external contour of the threaded element, for example a hex nut.

Figure 4:
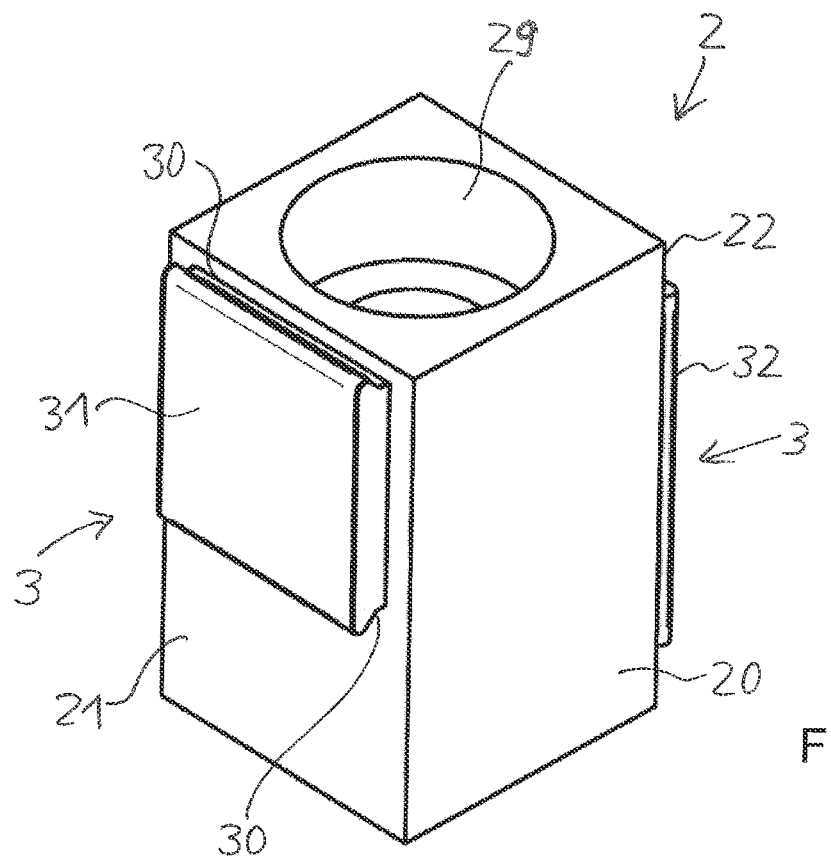
FIGS. 4, 5 show a fastening element in a second embodiment in different perspective representations.
Figure 5:
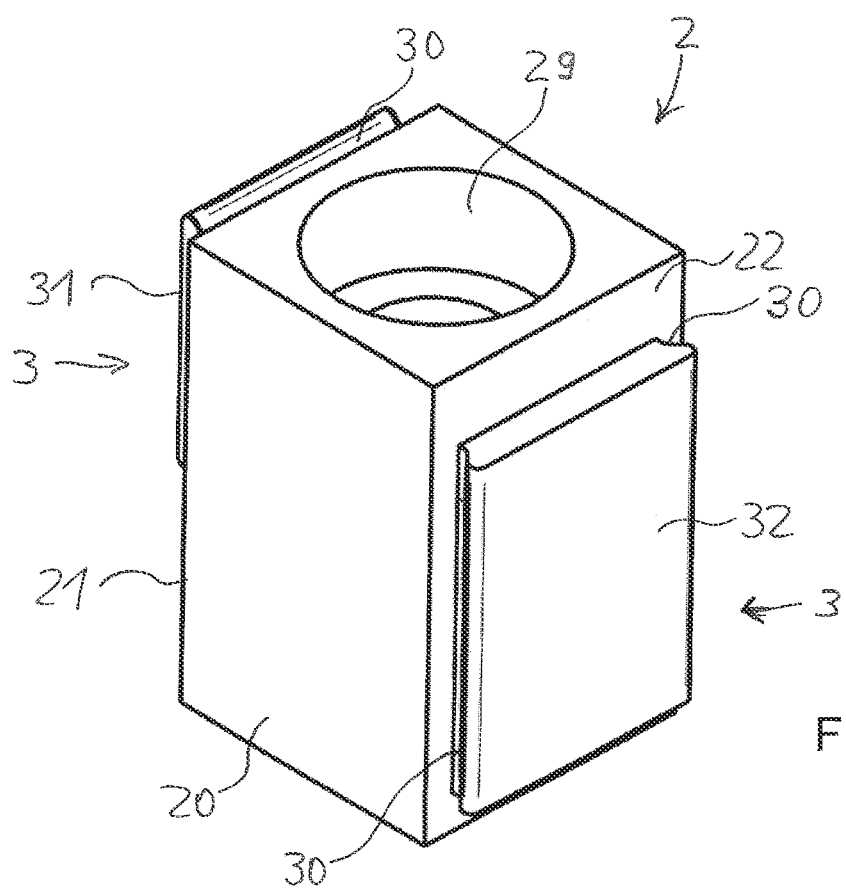

FIGS. 4 and 5 show an embodiment of the fastening element 2 that differs from the embodiment in FIGS. 1 to 3 in that the connecting arrangement 3 is composed of one first connecting element 31 and one second connecting element 32. The first connecting element 31 is arranged on the first external surface 21, the second connecting element 32 is arranged on the second external surface 22, with the first external surface 21 and the second external surface 22 being arranged on opposing sides or surfaces of the cuboid body 20 in this exemplary embodiment. The first connecting element 31 and the second connecting element 32 each have fastening contours 30, which in this case are designed so as not to be completely continuous on the perimeter, but instead each extend in one spatial direction. In this design, the fastening contours 30 of the first and second connecting elements 31, 32 have spatial directions that are orthogonal to one another. It is also evident that the first connecting element 31 is arranged off-center on the first external surface 21. The second connecting element 32 is arranged in the center of the second external surface 22.

Figure 6:
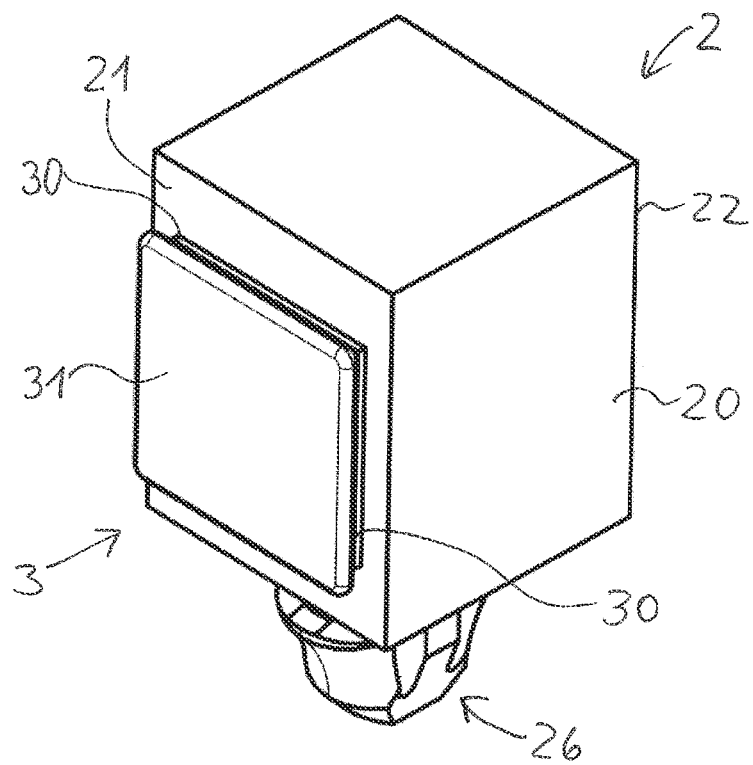
FIG. 6 shows a fastening element in a third embodiment in a perspective view.
Figure 7:
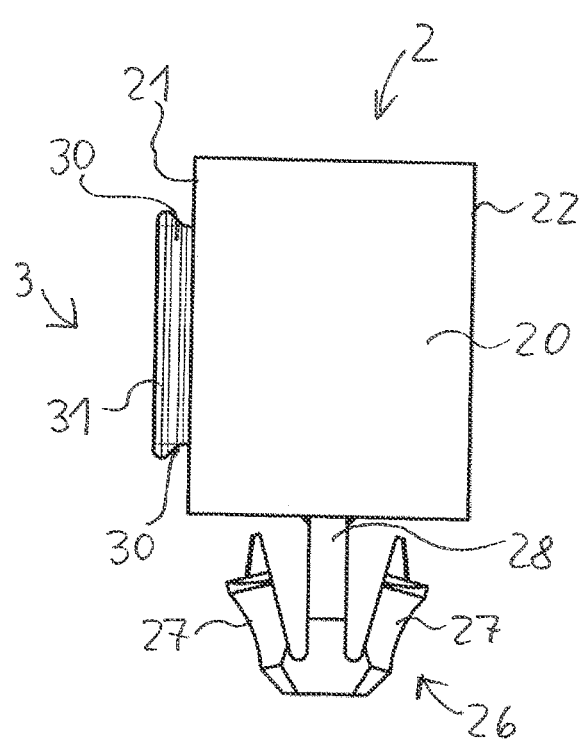
FIGS. 7, 8 show the fastening element from FIG. 6 in different side views.
Figure 8:
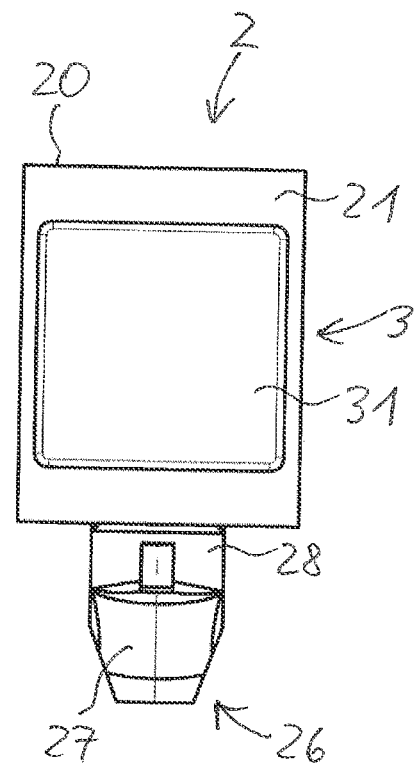

FIGS. 6 to 8 show an embodiment of a fastening element in which the through opening 29 is not present as in FIGS. 1 to 5 for mounting of the fastening element on the other component, but instead a snap-in mounting foot 26, which projects from an external surface of the fastening element 2 or of the body 20. The snap-in mounting foot 26 can be formed as a single piece on the body 20, for example. The snap-in mounting foot 26 has, fastened to the body 20, a support arm 28 from which one or more snap-in arms 27 project laterally. The connecting arrangement 3 in this case is designed comparably to that in FIGS. 1 to 3. It is clear that the connecting arrangement 3 can also be designed differently, for example in accordance with FIGS. 4 and 5.

Figure 9:
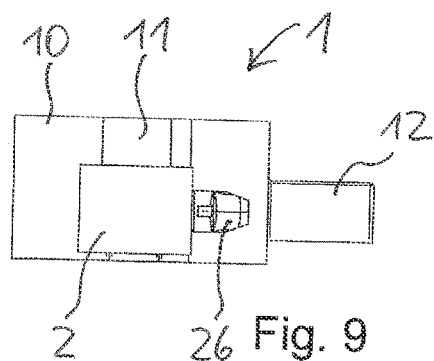
FIGS. 9-16 show embodiments of a set formed of a conductor connection element and a fastening element.
Figure 10:
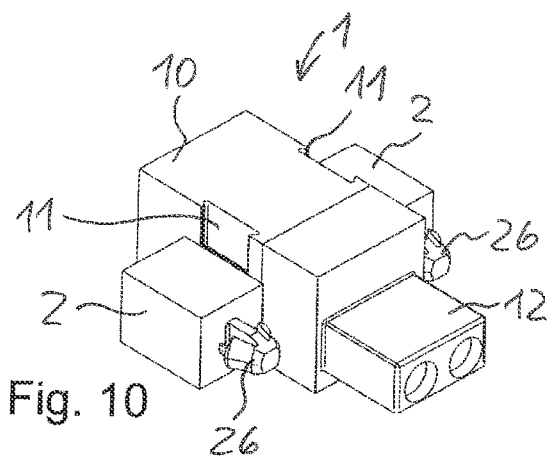

FIGS. 9, 11, 13, and 15 show side views of each depicted set formed of a conductor connection element 1 and a fastening element 2; FIGS. 10, 12, 14, and 16 show perspective views of each depicted set formed of a conductor connection element 1 and a fastening element 2. FIGS. 9 and 10 show a first variant, FIGS. 11 and 12 a second variant, FIGS. 13 and 14 a third variant, and FIGS. 15 and 16 a fourth variant of a set formed of a conductor connection element 1 and a fastening element 2.

As is evident from FIGS. 9 and 10, the set has a conductor connection element 1, which has a body 10. One or more retaining contours 11, which are each designed as counterparts to the connecting arrangement 3 of the fastening element 2, which is to say, for example, as counterparts to the first connecting element 31 or to the second connecting element 32, can be arranged on the body 10. In this exemplary embodiment, the fastening contours 30 of the connecting elements 31, 32 are pushed into the retaining contours 11 by a linear motion, for example. The first connecting element 31 and the second connecting element 32 on the one hand, and the retaining contours 11 on the other hand, can have mutually corresponding latching elements or stop elements so that the fastening elements 2 can be secured in a defined position relative to the body 10 of the conductor connection elements 1. The conductor connection element 1 has, in addition, an electrical contacting region 12, where the conductor connection element is designed as a plug-and-socket connector, for example.

FIGS. 9 and 10 show that respective fastening elements 2 can be fastened to the body 10 of the conductor connection element 1 in a positive-locking manner on each of two opposite sides of the body 10 by means of their connecting arrangement 3. The coupling means for coupling the fastening element 2 to the other component, in this case the snap-in mounting foot 26, faces in the direction of the contacting region 12 in the variant in FIGS. 9 and 10.

Figure 11:
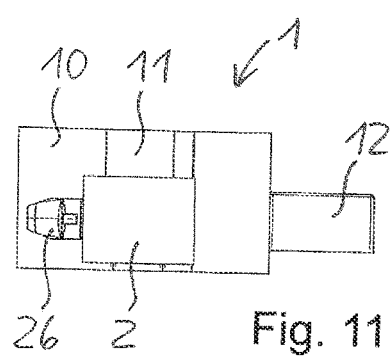
Figure 12:
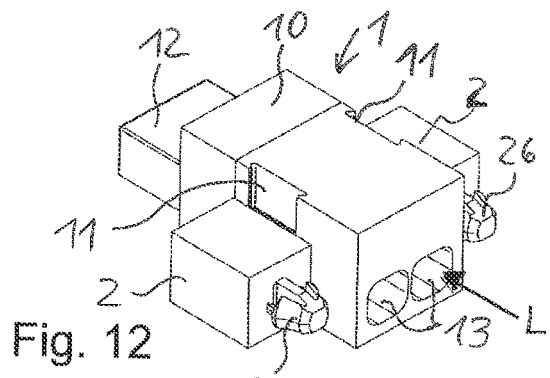

FIGS. 11 and 12 show the same set as FIGS. 9 and 10, wherein the fastening elements 2 are now fastened to the conductor connection element 1 in the opposite orientation. The coupling means, in this exemplary embodiment designed as snap-in mounting feet 26, now face in the direction of a side of the body 10 where conductor insertion openings 13 are present for the connection of electrical conductors.

It is also possible to fasten the fastening elements 2, or at least one of the fastening elements 2, to the conductor connection element 1 in an orientation rotated by 90 degrees, for example in such a manner that the coupling means faces up or down, which is to say perpendicular to a direction of conductor insertion L for the electrical conductors.

Figure 13:
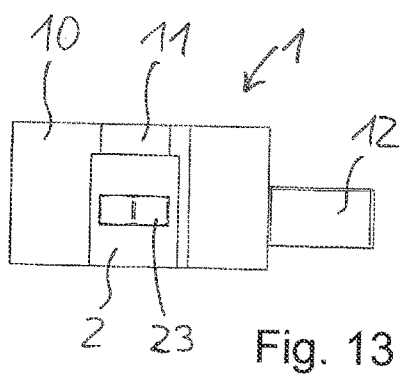
Figure 14:
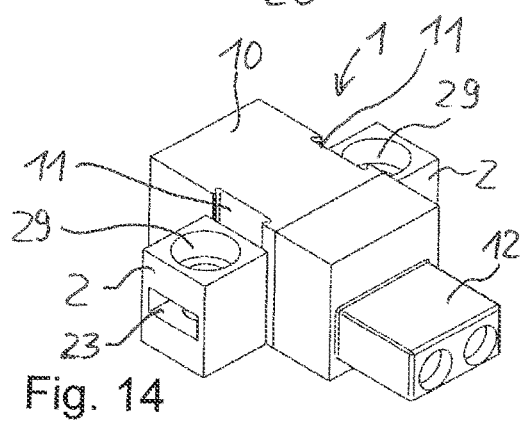
Figure 15:
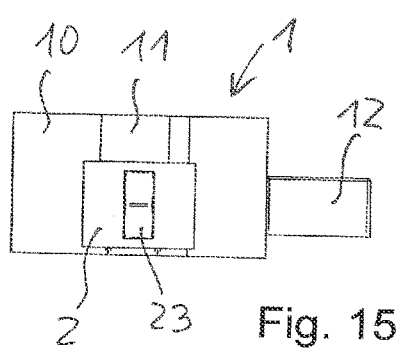
Figure 16:
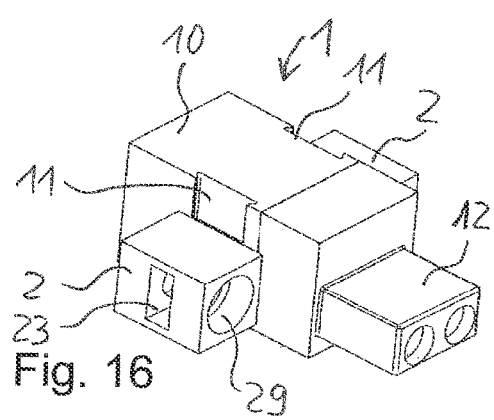

FIGS. 13 and 14 show the conductor connection element 1, as already represented in FIGS. 9 to 12, with fastening elements 2 in the embodiment from FIGS. 1 to 3 fastened thereto. The receiving space 23 for the threaded element and the through opening 29 are each visible on the fastening element 2. In FIGS. 13 and 14, the fastening elements 2 are connected to the conductor connection element 1 in such a manner that the through opening 29 extends vertically with respect to the direction of longitudinal extent of the conductor connection element, wherein the direction of longitudinal extent of the conductor connection element is parallel to the direction of conductor insertion. FIGS. 15 and 16 show the same set as FIGS. 13 and 14, wherein the fastening elements 2 are now fastened to the conductor connection element 1 in a different orientation rotated by 90 degrees. The through openings 29 are now oriented horizontally or in the direction of longitudinal extent of the conductor connection element.

It is possible that the fastening element 2 according to the exemplary embodiment in FIGS. 1 to 3 and FIGS. 13 to 16 has no receiving space 23 for a threaded element, but instead only has a through opening 29 for receiving and passage of, for example, a screw, wherein the screw engages a thread arranged on the other component in the fastened state.

Figure 17:
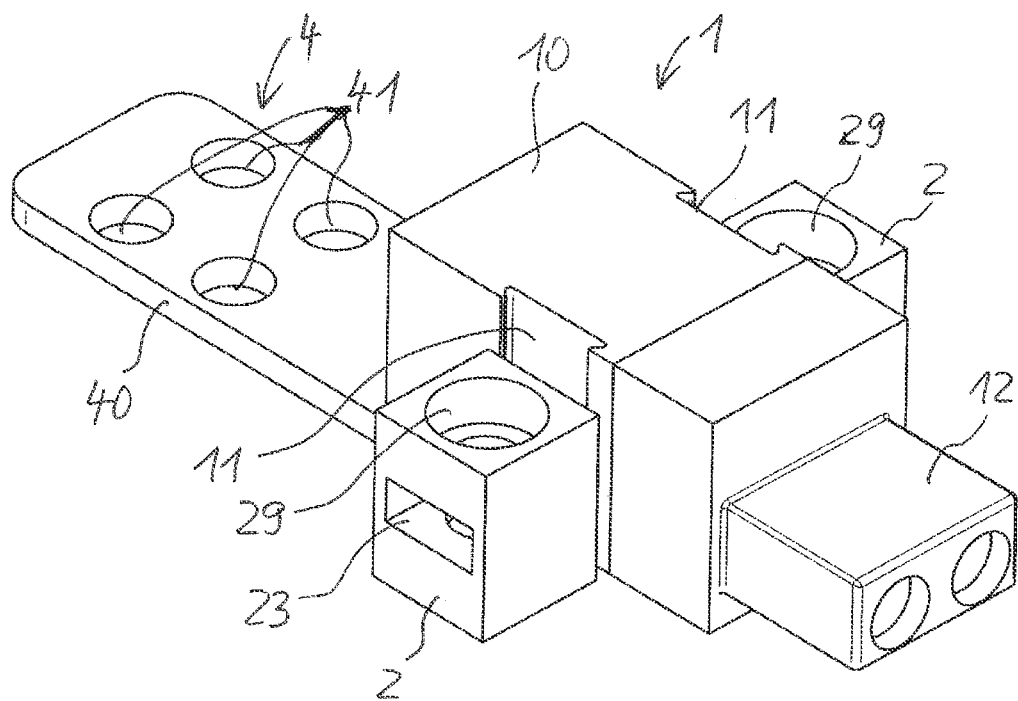
FIG. 17 shows the set from FIG. 14 with an additional fastening tab in a perspective view.

FIG. 17 shows the set already shown in FIG. 14 as an example for an expansion of the set with a fastening plate 4, which can be fastened to the conductor connection element 1 and/or to the fastening elements 2. The fastening plate 4 has a body 40 with fastening openings 41. The fastening plate 4 can be screwed to another object through the fastening openings 41, for example. In addition, when the fastening plate 4 is used as a strain relief tab, strain relief for electrical conductors can be provided by this means, for example, in that the electrical conductors are secured to the strain relief tab with, e.g., cable ties passed through the fastening openings 41.

Figure 18:
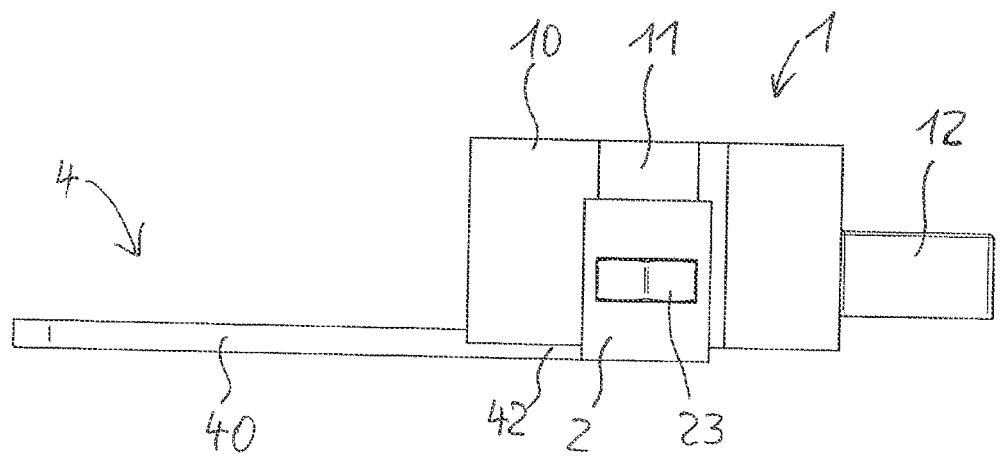
FIG. 18 shows the arrangement from FIG. 17 in side view.

FIG. 18 shows the arrangement from FIG. 17 in side view. It is evident that the fastening tab 4 is coupled to the conductor connection element 1 through a region 42.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A connecting arrangement comprising:
    a conductor connection element having an insulating housing with a conductor insertion opening adapted for inserting an electrical conductor in a direction of conductor insertion; and
    a fastening element for fastening the conductor connection element to another component, the fastening element having a connecting arrangement via which the fastening element is adapted to be fastened to the conductor connection element in a positive-locking manner,
    wherein the connecting arrangement includes a first connecting element that is configured to allow a fastening of the fastening element to the conductor connection element in multiple different discrete spatial orientations relative to the direction of conductor insertion, such that the fastening element is fastenable to the conductor connection element by the first connecting element in different angular positions that differ from one another by 90° relative to the direction of conductor insertion.

2. The connecting arrangement according to claim 1, wherein the connecting arrangement is configured to allow a fastening of the fastening element to the conductor connection element in two, three, or four different spatial orientations relative to the direction of conductor insertion.

3. The connecting arrangement according to claim 1, wherein the connecting arrangement is configured for fastening of the fastening element to the conductor connection element via a linear displacement of the fastening element relative to the conductor connection element.

4. The connecting arrangement according to claim 1, wherein the fastening element has a through opening that is configured for fastening of the fastening element to the other component via a screw, an elongated stud, a rivet, or an elongated fastener that is adapted to be passed through the through opening.

5. The connecting arrangement according to claim 1, wherein the fastening element has a threaded element or a receiving space for a threaded element, wherein the fastening element is adapted to be fastened to the other component through the threaded element by means of screw mounting.

6. The connecting arrangement according to claim 1, wherein the connecting arrangement has the first connecting element or the first connecting element and a second connecting element.

7. The connecting arrangement according to claim 6, wherein the first connecting element is arranged on a first external surface of the fastening element, and the second connecting element is arranged on a second external surface of the fastening element.

8. The connecting arrangement according to claim 7, wherein the first connecting element is arranged off-center on the first external surface.

9. The connecting arrangement according to claim 7, wherein the second connecting element is arranged in the center of the second external surface.

10. The connecting arrangement according to claim 7, wherein the second external surface is an external surface provided on an opposite side of the fastening element than the first external surface.

11. The connecting arrangement according to claim 6, wherein the second connecting element is configured to allow a fastening of the fastening element to the conductor connection element in an angular position that differs by 90° from the angular position in which the first connecting element allows a fastening of the fastening element to the conductor connection element.

12. The connecting arrangement according to claim 6, wherein the first and/or the second connecting element has a fastening contour that is designed as a dovetail profile or the like.

13. The connecting arrangement according to claim 1, wherein the fastening element has an essentially cuboid body on which the connecting arrangement is arranged on one external cuboid surface or distributed over multiple external cuboid surfaces of the body.

14. A set formed of a conductor connection element in the form of a plug-and-socket connector and a mating connector associated with the plug-and-socket connector as a counterpart, wherein at least one fastening element according to claim 1 is fastened on the plug-and-socket connector and/or on the mating connector via the connecting arrangement.

15. A non-transitory data carrier with CAD design data for the design of the fastening element of the connecting arrangement according to claim 1.

\* \* \* \* \*